United States Patent
Epshteyn

(10) Patent No.: US 8,260,053 B2
(45) Date of Patent: Sep. 4, 2012

(54) DEVICE AND METHOD FOR VIRTUALIZING AN IMAGE SENSOR

(75) Inventor: Alan J. Epshteyn, Miller Place, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 1302 days.

(21) Appl. No.: 11/953,241

(22) Filed: Dec. 10, 2007

(65) Prior Publication Data

US 2009/0148044 A1 Jun. 11, 2009

(51) Int. Cl.
*G06K 9/00* (2006.01)
*G06K 9/18* (2006.01)
*G06K 9/40* (2006.01)
*G06K 7/10* (2006.01)
*G06K 15/12* (2006.01)

(52) U.S. Cl. ............ 382/183; 382/260; 235/462.01; 235/462.41; 359/889

(58) Field of Classification Search .......... 382/182–187, 382/260–265; 235/462.01, 462.41, 462.48; 359/885–892
See application file for complete search history.

(56) References Cited

U.S. PATENT DOCUMENTS

| | | | | |
|---|---|---|---|---|
| 5,473,149 A * | 12/1995 | Miwa et al. | ............... | 235/462.41 |
| 5,706,093 A * | 1/1998 | Komiya | ............ | 356/418 |
| 5,756,981 A * | 5/1998 | Roustaei et al. | ......... | 235/462.42 |
| 6,568,597 B2 * | 5/2003 | Krichever et al. | ........ | 235/462.32 |
| 7,176,881 B2 * | 2/2007 | Nishimura et al. | ........... | 345/156 |
| 7,178,733 B2 | 2/2007 | Zhu et al. | | |
| 7,913,922 B1 * | 3/2011 | Roth | ............................. | 235/494 |
| 2002/0063160 A1 * | 5/2002 | Krichever et al. | ........ | 235/462.32 |
| 2003/0034398 A1 * | 2/2003 | Krichever et al. | ........ | 235/462.35 |
| 2003/0062419 A1 * | 4/2003 | Ehrhart et al. | ................ | 235/469 |
| 2006/0013314 A1 | 1/2006 | Vella et al. | | |
| 2007/0002159 A1 | 1/2007 | Olsen et al. | | |
| 2007/0187511 A1 * | 8/2007 | Meffre | ..................... | 235/462.04 |
| 2010/0183199 A1 * | 7/2010 | Smith et al. | .................... | 382/117 |
| 2010/0217723 A1 * | 8/2010 | Sauerwein et al. | ........... | 705/337 |

FOREIGN PATENT DOCUMENTS

WO 2009075967 6/2009

OTHER PUBLICATIONS

International Search Report and Written Opinion dated Dec. 19, 2008 in related case PCT/US2008/082331.
International Preliminary Report on Patentability dated Jun. 24, 2010 in related case PCT/US2008/082331.

* cited by examiner

*Primary Examiner* — Aaron W Carter

(57) ABSTRACT

A method virtualizes an image sensor. The method comprises selecting one of at least two portions of a filter to use as a function of a mode of operation. The method comprises capturing an image using the selected one of the at least two portions. The method comprises executing a functionality using data extracted from the image. The functionality corresponds to the mode of operation.

17 Claims, 3 Drawing Sheets

DEVICE AND METHOD FOR VIRTUALIZING AN IMAGE SENSOR

FIELD OF THE INVENTION

The present invention relates generally to a device and method for virtualizing an image sensor. Specifically, an image capturing device is optimized as a function of a type of functionality to be performed.

BACKGROUND

A mobile unit (MU) may be equipped with various kinds of components. The MU may also be configured to execute multiple different functionalities using the components of the MU. Certain components of the MU may also be configured to execute more than one functionality. Parameters relating to a first functionality may differ from parameters relating to a second functionality. For example, an image capturing device such as a camera may be used for several different functionalities such as taking pictures, barcode reading, OCR, etc. However, when taking pictures, color cameras are often preferred while when reading barcodes, a monochrome camera provides better results. Because the components relating to image capture such as a lens, image sensor, etc. are complex and expensive, the MU is usually not equipped with multiple image capturing devices. Furthermore, to provide additional image capturing devices increases an overall size of the MU, increases costs of manufacture, etc. Thus, there is a need for an image capturing device to be able to be dynamically tuned as a function of a mode of operation (i.e., functionality).

SUMMARY OF THE INVENTION

The present invention relates to a method for virtualizing an image sensor. The method comprises selecting one of at least two portions of a filter to use as a function of a mode of operation. The method comprises capturing an image using the selected one of the at least two portions. The method comprises executing a functionality using data extracted from the image. The functionality corresponds to the mode of operation.

DETAILED DESCRIPTION

Figure 1:
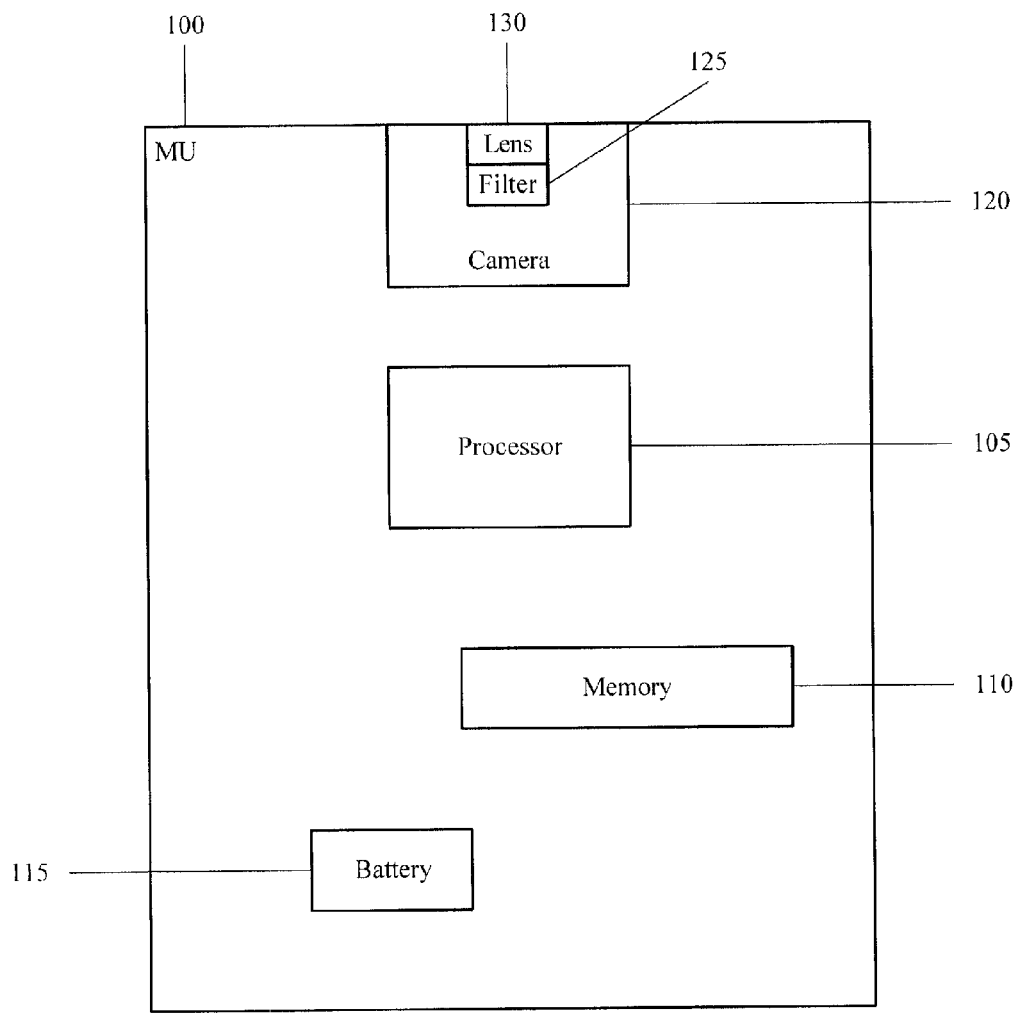
FIG. 1 shows a mobile unit according to an exemplary embodiment of the present invention.

The exemplary embodiments of the present invention may be further understood with reference to the following description and the appended drawings, wherein like elements are referred to with the same reference numerals. The exemplary embodiments of the present invention describe a mobile unit (MU) equipped with a data acquisition device where the data acquisition device may be dynamically tuned as a function of a mode of operation. Specifically, a filter may be disposed over the data acquisition device to enable the tuning. The MU, the data acquisition device, and the filter will be discussed in more detail below.

It should be noted that the following description of the exemplary embodiments illustrates a camera for the data acquisition device. However, the camera may represent any type of data acquisition device that is not specifically designed and tailored for a barcode scanning functionality. In addition, it should be noted that the following description of the exemplary embodiments illustrates an MU. However, the exemplary embodiments of the present invention may be applied to any computing device, whether mobile or not. Furthermore, it should be noted that the MU including the data acquisition device is only exemplary. The MU may not be equipped with the data acquisition device and, thus, the data acquisition device may be coupled with the MU. For example, the data acquisition device may be a module that is coupled externally to the MU. Finally, it should be noted that the use of barcodes is only exemplary. The barcode scanning functionality may represent any scanning functionality. Thus, the exemplary embodiments of the present invention may relate to scanning any form of data such as a one-dimensional barcode, a two-dimensional barcode, a color barcode, infra-red data, ultraviolet data, OCR, etc.

FIG. 1 shows a mobile unit (MU) 100 according to an exemplary embodiment of the present invention. The MU 100 may be any electronic device (e.g., portable or stationary) that utilizes a portable power supply (e.g., battery, capacitor, super capacitor, etc.). For example, the MU 100 may be a mobile computer, a personal digital assistant (PDA), a laptop, a pager, a cell phone, a radio frequency identification reader, a scanner, an image capturing device, etc. The MU 100 may include a processor 105, a memory 110, a battery 115, and a camera 120.

The processor 105 may be responsible for executing various functionalities of the MU 100. Specifically, according to the exemplary embodiments of the present invention, the processor 105 may be responsible for controlling the filter 125 as a function of a mode of operation. The memory 110 may be a storage unit for the MU 100. Specifically, the memory 110 may store a program or settings relating to how data from the filter 125 is to be interpreted as a function of the mode of operation. The memory 100 may also store data and/or settings pertaining to various other functionalities of the MU 100. As discussed above, the MU 100 may include a portable power supply. As illustrated, the MU 100 may include the battery 115 to supply the necessary energy to operate the MU 100.

The camera 120 may be an image capturing device. Specifically, the camera 120 may be a conventional digital camera. Thus, the camera 120 may include at least one lens 130, a shutter, an image sensor, etc. Light passing through the lens 130 may be received and subsequently converted to corresponding digital signals that are used to recreate the image. Those skilled in the art will understand that the camera 120 is capable of capturing color images to duplicate an object, a scene, etc. in a condition at a moment of the capture. The camera 120 may also enable a continuous set of images to be captured in a finite time period. That is, the camera 120 may be configured to capture streaming images or a video. Any image captured by the camera 120 (e.g., single image, set of images, etc.) may be stored on the memory 110. As will be discussed in further detail below, the camera 120 may include multiple lenses 130 to facilitate a capturing of further images using the filter 125.

Figure 2:
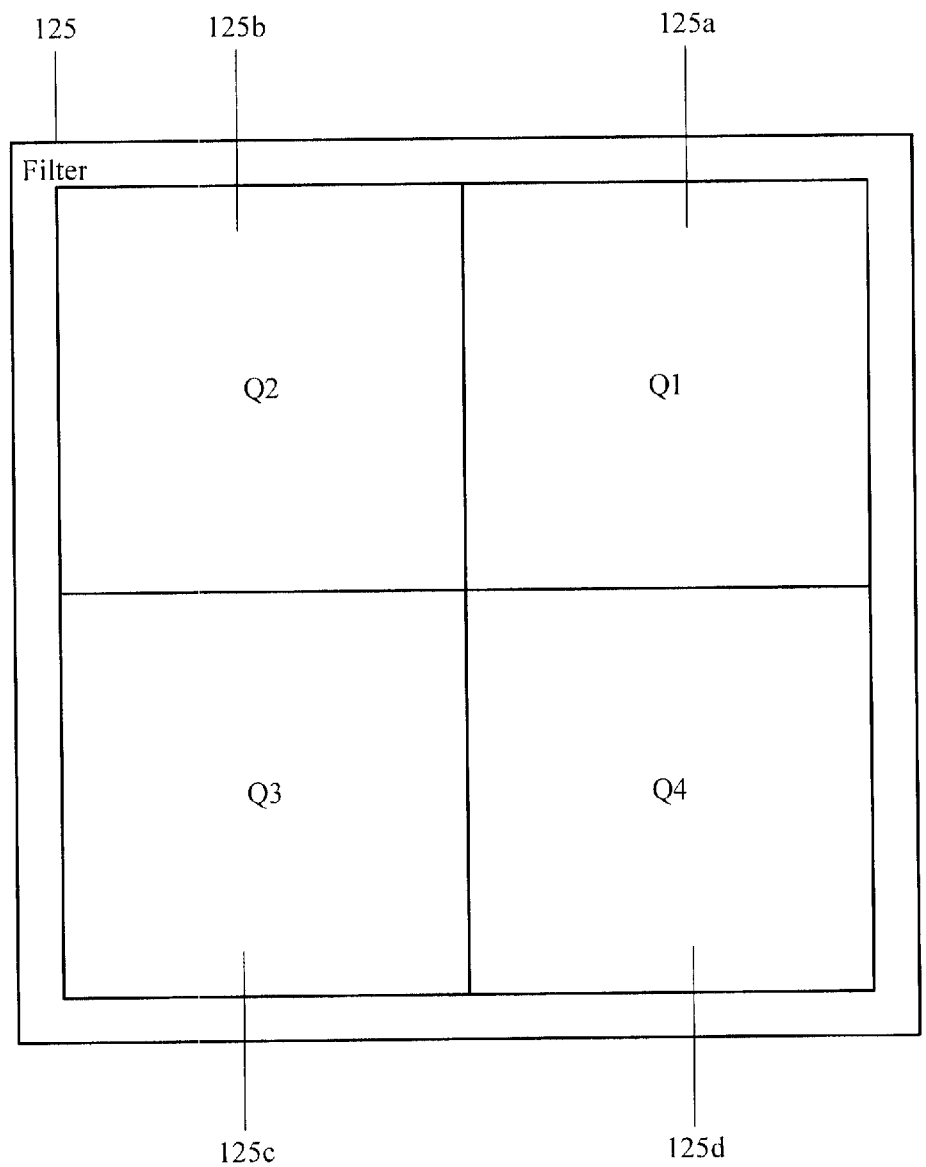
FIG. 2 shows a filter used for dynamically tuning an image capturing device according to an exemplary embodiment of the present invention.

The camera 120 may also include a filter 125. The filter 125 may be a device that controls parameters relating to light that the camera 120 is to receive. FIG. 2 shows the filter 125 used for dynamically tuning the camera 120 according to an exemplary embodiment of the present invention. The filter 125 may exhibit a substantially rectangular shape. The filter 125 may be a corresponding resolution to a sensor of the camera 120. For example, if the sensor of the camera 120 is two megapixels, the filter 125 may also be two total megapixels.

According to one exemplary embodiment of the present invention, the filter 125 may be divided into four quadrants 125*a-d*. The lens 130 may be disposed over the filter 125. In another exemplary embodiment with multiple lenses 130, a respective lens may be disposed over each quadrant of the filter 125. The first quadrant 125*a* may be a Bayer (RGB) color filter that is conventionally used in color cameras. Thus, the first quadrant 125*a* may be used for taking pictures. The second quadrant 125*b* may be panchromatic (i.e., clear) that is conventionally used with barcode functionalities. Thus, the second quadrant 125*b* may be used for scanning barcodes. The third quadrant 125*c* and the fourth quadrant 125*d* may be configured for other lighting conditions. For example, a mixture of the Bayer color filter and the panchromatic filter may be used. The mixture may be of different proportions so that, for example, the third quadrant 125*c* may be half Bayer filter and half panchromatic while the fourth quadrant 125*d* may be three-quarters Bayer filter and one-quarter panchromatic. In another example, the third quadrant 125*c* may be an ultraviolet (UV) filter that is only sensitive to UV light while the fourth quadrant 125*d* may be an infrared (IR) filter that is only sensitive to IR light.

Because the filter 125 of this exemplary embodiment of the present invention is divided into the four quadrants 125*a-d*, the resolution corresponding to each quadrant may be a portion of the entire resolution of the image sensor of the camera 120. Thus, when the four quadrants 125*a-d* are of equal size, each quadrant 125*a-d* may be used for images with exactly one-quarter the resolution of the camera 120. That is, the sensor of the camera 120 may capture an image with one-quarter of the total resolution. For example, if the sensor of the camera 120 is two-megapixels, each quadrant 125*a-d* may be used to create an image exhibiting a half-megapixel resolution. When the four quadrants 125*a-d* are of different sizes, corresponding resolutions may exist for each quadrant 125*a-d*. If the first quadrant 125*a* that is a Bayer filter has a higher resolution (e.g., half the entire resolution), the other three quadrants 125*b-d* may have smaller resolutions. For example, with a two-megapixel resolution, the first quadrant 125*a* may be one megapixel while each of the other quadrants 125*b-d* may be of a one-third megapixel resolution.

The selection of a quadrant of the filter 125 may be stored in the memory 110 so that when the processor 105 receives data relating to a mode of operation that the MU 100 is to execute, an appropriate quadrant may be selected. For example, if the MU 100 is to take an image, data from the first quadrant 125*a* may be used; if the MU 100 is to scan a barcode, data from the second quadrant 125*b* may be used; etc. That is, light may be received by the camera 120 from the entire filter 125. However, only light received from a particular quadrant may be used by the processor 105.

In a first exemplary embodiment with a single lens 130, the lens 130 of the camera 120 may be configured so that the image captured by the camera 120 is focused to the respective quadrant of the filter 125. For example, the lens 130 of the camera 120 may be moved so that a focusing may be performed using a particular quadrant. In another example, the lens 130 of the camera 120 may be angled according to the respective quadrant. In a second exemplary embodiment of the present invention, multiple lenses 130 may be disposed for each quadrant, for predetermined quadrants, etc. Thus, a configuration of the lens 130 may not be necessary. That is, data may be captured through the filter 125 as the lenses 130 are already configured to focus the image without a configuration thereto. The multiple lenses 130 may also enable multiple images to be captured concurrently. Thus, an image using the first quadrant 125*a* may be taken and an image using the second quadrant 125*b* may be taken. Upon receiving data form the two quadrants, the processor may separate, analyze, process, etc. the data accordingly. For example, a barcode may be disposed over an ultraviolet symbol that appears invisible to a user. An image of the barcode using the first quadrant 125*a* and of the symbol using the fourth quadrant 125*d* (that is configured for UV light) may be captured so that multiple forms of data are ready for analysis. In another example, the multiple lenses 130 may be used to for a symbol that is encoded with varying depths. A symbol may include a first part disposed at a furthest depth may be an ultraviolet symbol while a second part disposed at a closest depth may be a one-dimensional barcode. Through focusing of the multiple lenses 130, the data for the different parts of the symbol may be captured.

It should be noted that the configuration of the lens 130 of the camera 120 is only exemplary. In another embodiment, the lens 130 may be stationary while an image sensor disposed behind the lens 130 is moved or angled so that a proper focusing takes place for capturing the image. Similar to the lens 130, multiple image sensors may be disposed behind each quadrant so that multiple forms of data may be received.

Figure 3:
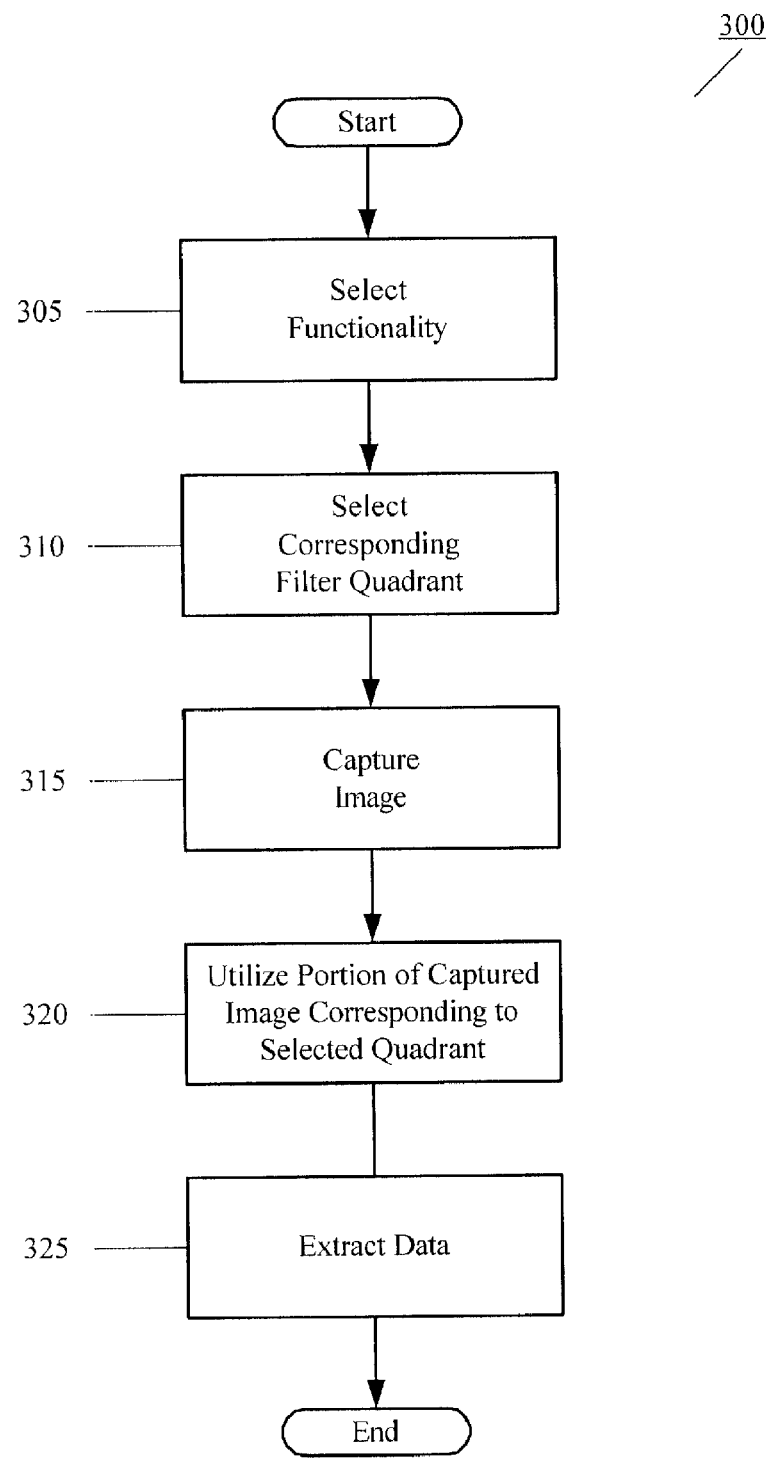
FIG. 3 shows a method for dynamically tuning an image capturing device as a function of a mode of operation according to an exemplary embodiment of the present invention.

FIG. 3 shows a method 300 for dynamically tuning an image capturing device as a function of a mode of operation according to an exemplary embodiment of the present invention. The method 300 will be described with reference to the components of the MU 100 of FIG. 1 and the filter 125 of FIG. 2. It may be assumed that the MU 100 and the camera 120 are already activated prior to execution of the method 300.

In step 305, a functionality is selected. That is, a mode of operation is selected on the MU 100. The modes of operation may include, for example, taking a picture, scanning a barcode, etc. The mode of operation may be known by the processor 105. As discussed above, multiple functionalities may be selected when the MU 100 is configured to receive multiple forms of data (e.g., multiple lenses 130). It should be noted that step 305 is only exemplary and may not be required. The selection of the functionality may imply that single lens 130 is disposed over the filter. Thus, the selection determines how the lens 130 is to be configured with respect to the filter 125. When multiple lenses 130 are disposed, data may be captured using the entire filter 125. The execution of the functionality may be the basis for selecting the quadrant of the filter, as will be explained with reference to step 310.

In step 310, a corresponding quadrant of the filter 125 is selected. The MU 100 may include a database stored in the memory 110 indicating an appropriate quadrant (e.g., 125*a-d*) to be used when a mode of operation is selected. For example, the first quadrant 125*a* is used for taking pictures; the second quadrant 125*b* is used for scanning a barcode; etc. Thus, the processor 105 may access the database stored on the memory 110 and determine the appropriate quadrant related to the mode of operation. The processor 105 may transmit a signal to the camera 120 indicating the selected quadrant.

In step 315, an image is captured. As discussed above, depending on the selected quadrant, the camera 120 orients itself so that an image is captured using the selected quadrant. Thus, the lens 130 or the image sensor of the camera 120 is configured to focus the image (e.g., moving, angling, etc. the lens 130 or the image sensor) to be captured with respect to the selected quadrant. Therefore, light passing through one of the quadrants 125*a-d* of the filter 125 is received by the camera 120.

In step 320, the captured image corresponding to the selected quadrant is used. Once the quadrant is selected, only the portion of the image corresponding to the selected quadrant is transmitted from the camera 120 to the processor 105. Thus, the processor 105 is only receiving a portion of the total resolution of the camera 120. Upon receiving this portion, data may be extracted for processing (i.e., step 325).

As discussed above, step 320 may entail other steps, in particular when the MU 100 is configured to receive different types of data using different quadrants of the filter 125. For example, more than one captured image corresponding to the selected quadrant may be processed. In step 305, more than one functionality may be chosen. Thus, in step 310, more than one quadrant is selected. The selected quadrants correspond to the selected functionalities. Capturing the image in step 315 may also include angling and/or moving components of the camera 120 so that a proper image may be captured using the selected quadrants. The processor 105 may receive the data corresponding to the different quadrants and differentiate them for further processing. The differentiation of the data may be performed using predetermined parameters stored in the memory 110. For example, data from the first quadrant 125a may be identified as colors in the visible spectrum are included; data from the second quadrant 125b may be identified as various shades of gray are included; data from the third quadrant 125c may be identified as IR intensities are included; and data from the fourth quadrant 125d may be identified as UV intensities are included. In the embodiments where the quadrant is a mixture of two other quadrants, a concurrent capturing of images may not be performed as the processor 105 may not be able to discern between the data received from the camera 120. However, the memory 110 may include predetermined parameters to allow the differentiation of the data in this embodiment as well.

It will be apparent to those skilled in the art that various modifications may be made in the present invention, without departing from the spirit or scope of the invention. Thus, it is intended that the present invention cover the modifications and variations of this invention provided they come within the scope of the appended claims and their equivalents.

What is claimed is:

1. A method, comprising:
    selecting one of at least two portions of a filter to use as a function of a mode of operation, each of the at least two portions of the filter occupying a respective area of the filter and having a part of a total resolution corresponding to a percentage that the respective area occupies on the filter;
    capturing an image using the selected one of the at least two portions; and
    executing a functionality using data extracted from the image, the functionality corresponding to the mode of operation.

2. The method of claim 1, wherein the plurality of modes of operation includes at least taking a picture and scanning a barcode.

3. The method of claim 2, wherein a first portion of the at least two portions is used for taking the picture and a second portion of the at least two portions is used for scanning the barcode.

4. The method of claim 1, wherein a resolution of the image is a function of the selected one of the at least two portions of the filter.

5. The method of claim 1, wherein the filter includes four quadrants.

6. The method of claim 5, wherein a first quadrant is a Bayer filter, a second quadrant is a panchromatic filter, and each of a third quadrant and a fourth quadrant is one of an infrared filter, an ultraviolet filter, and a mixture of the Bayer filter and the panchromatic filter.

7. The method of claim 5, wherein the filter has a two megapixel resolution.

8. The method of claim 7, wherein each quadrant has a half megapixel resolution.

9. A device, comprising:
    a filter including at least two portions, a selection of one of the at least two portions is a function of a mode of operation of the device, each of the at least two portions of the filter occupying a respective area of the filter and having a part of a total resolution corresponding to a percentage that the respective area occupies on the filter; and
    a data acquisition device disposed behind the filter capturing an image using the selected one of the at least two portions.

10. The device of claim 9, wherein the plurality of modes of operation includes at least taking a picture and scanning a barcode.

11. The device of claim 10, wherein a first portion of the at least two portions is used for taking the picture and a second portion of the at least two portions is used for scanning the barcode.

12. The device of claim 9, wherein a resolution of the image is a function of the selected one of the at least two portions of the filter.

13. The device of claim 9, wherein the filter includes four quadrants.

14. The device of claim 13, wherein a first quadrant is a Bayer filter, a second quadrant is a panchromatic filter, and each of a third quadrant and a fourth quadrant is one of an infrared filter, an ultraviolet filter, and a mixture of the Bayer filter and the panchromatic filter.

15. The device of claim 13, wherein the filter has a two megapixel resolution.

16. The device of claim 15, wherein each quadrant as a half megapixel resolution.

17. A device, comprising:
    a filtering means for capturing a type of data, the filtering means including at least two portions, a selection of one of the at least two portions is a function of a mode of operation of the device, each of the at least two portions of the filtering means occupying a respective area of the filter and having a part of a total resolution corresponding to a percentage that the respective area occupies on the filtering means; and
    a data acquisition means disposed behind the filtering means for capturing an image using the selected one of the at least two portions, the image being captured with the type of data.

* * * * *

UNITED STATES PATENT AND TRADEMARK OFFICE
CERTIFICATE OF CORRECTION

PATENT NO. : 8,260,053 B2
APPLICATION NO. : 11/953241
DATED : September 4, 2012
INVENTOR(S) : Epshteyn It is certified that error appears in the above-identified patent and that said Letters Patent is hereby corrected as shown below:

In the Specification:

In Column 1, Line 44, before "DESCRIPTION", insert -- BRIEF --.

In Column 4, Line 6, delete "form" and insert -- from --, therefor.

In the Claims:

In Column 6, Line 45, in Claim 16, delete "as" and insert -- has --, therefor.

Signed and Sealed this
Tenth Day of September, 2013

Teresa Stanek Rea
*Acting Director of the United States Patent and Trademark Office*